US012810188B2

(12) United States Patent
Tsai et al.

(10) Patent No.: US 12,810,188 B2
(45) Date of Patent: Nov. 24, 2026

(54) ANTISITE DEFECT QUBITS IN MONOLAYER TRANSITION METAL DICHALCOGENIDES

(71) Applicants: Northeastern University, Boston, MA (US); Academia Sinica, Nankang (TW); Temple University-Of The Commonwealth System Of Higher Education, Philadelphia, PA (US)

(72) Inventors: Jeng-Yuan Tsai, Philadelphia, PA (US); Jinbo Pan, Philadelphia, PA (US); Hsin Lin, Nankang (TW); Arun Bansil, Dover, MA (US); Qimin Yan, Philadelphia, PA (US)

(73) Assignees: Northeastern University, Boston, MA (US); Academia Sinica, Nankang (TW); Temple University-Of The Commonwealth System Of Higher Education, Philadelphia, PA (US)

( * ) Notice: Subject to any disclaimer, the term of this patent is extended or adjusted under 35 U.S.C. 154(b) by 850 days.

(21) Appl. No.: 18/250,648

(22) PCT Filed: Nov. 23, 2021

(86) PCT No.: PCT/US2021/072573
§ 371 (c)(1),
(2) Date: Apr. 26, 2023

(87) PCT Pub. No.: WO2022/109625
PCT Pub. Date: May 27, 2022

(65) Prior Publication Data

US 2023/0409951 A1 Dec. 21, 2023

Related U.S. Application Data

(60) Provisional application No. 63/117,284, filed on Nov. 23, 2020.

(51) Int. Cl.
*G06N 10/40* (2022.01)
*G06N 10/20* (2022.01)
*H10D 48/00* (2025.01)

(52) U.S. Cl.
CPC ............ *G06N 10/40* (2022.01); *G06N 10/20* (2022.01); *H10D 48/383* (2025.01); *H10D 48/385* (2025.01)

(58) Field of Classification Search
CPC ........ G06N 10/00; G06N 10/60; G06N 10/70; G06N 10/80; G06N 10/40; G06N 10/20;
(Continued)

(56) References Cited

U.S. PATENT DOCUMENTS

2019/0352190 A1* 11/2019 Dryfe .................. C01G 39/006
2020/0309595 A1 10/2020 Lukin et al.
(Continued)

OTHER PUBLICATIONS

Notification of Transmittal of the International Search Report and The Written Opinion of the International Searching Authority, or the Declaration, issued for International Application No. PCT/US2021/072573, entitled "Antisite Defect Qubits in Monolayer Transition Metal Dichalcogenides," mailed Mar. 14, 2022.
(Continued)

*Primary Examiner* — Paul Dinh
(74) *Attorney, Agent, or Firm* — Hamilton, Brook, Smith & Reynolds, P.C.

(57) ABSTRACT

Anion antisite defects in monolayer Transition Metal Dichalcogenide (TMD) systems are here identified as two-dimensional solid-state defect qubits. The proposed antisites in these TMDs host paramagnetic triplet ground states with flexible level splitting. A viable transition loop between the triplet and singlet defect states is demonstrated, including optical excitations/relaxations and nonradiative decay paths for the antisites as qubits. A complete set of qubit operational
(Continued)

processes, including initialization, manipulation, and readout, is delineated.

16 Claims, 8 Drawing Sheets

(58) Field of Classification Search
CPC .... H10D 48/383; H10D 48/385; B82Y 10/00; B82Y 15/00; B82Y 25/00
USPC .......................................................... 716/100
See application file for complete search history.

(56) References Cited

U.S. PATENT DOCUMENTS

| | | | | |
|---|---|---|---|---|
| 2022/0380934 | A1* | 12/2022 | Kempa | C01B 19/007 |
| 2023/0274175 | A1* | 8/2023 | Lechner | G06F 30/392<br>716/100 |

OTHER PUBLICATIONS

Lamountain, et al., "Environmental Engineering of Transition Metal Dichalcogenide Optoelectronics," Front. Phys. 13(4), 138114 (2018).
Lin, et al., "Defect Engineering of Two-Dimensional Transition Metal Dichalogenides," 2D Mater. 3(2016) 022002.
Smart, et al., "Intersystem Crossing and Exciton-Defect Coupling of Spin Defects in Hexagonal Boron Nitride," npj Computational Materials (2021) 59, 8 pages.
Tsai, et al., "Antisite Defect Qubits in Monolayer Transition Metal Dichalcogenides," Nature Communications (2022) 13:492 (https://doi.org/10.1038/s41467-022-28133-x | www.nature.com/naturecommunications).
Wang, et al., "Selective Antisite Defect Formation in WS2 Monolayers via Reactive Growth on Dilute W—Au Alloy Substrates," Advanced Materials, vol. 34, Issue 3, 2106674 (Nov. 5, 2021).

* cited by examiner

ANTISITE DEFECT QUBITS IN MONOLAYER TRANSITION METAL DICHALCOGENIDES

RELATED APPLICATION

This application is the U.S. National Stage of International Application No. PCT/US2021/072573, filed Nov. 23, 2021, which designates the U.S., published in English, and claims the benefit of U.S. Provisional Application No. 63/117,284, filed on Nov. 23, 2020. The entire teachings of the above applications are incorporated herein by reference.

GOVERNMENT SUPPORT

This invention was made with government support under Grant No. DE-SC0019275 awarded by the Department of Energy. The government has certain rights in the invention.

BACKGROUND

The ongoing second quantum revolution calls for exploiting the laws of quantum mechanics in transformative new technologies for computation and quantum information science (QIS) applications (1). Spin-qubits based on solid-state defects have emerged as promising candidates because these qubits can be initialized, selectively controlled, and readout with high fidelity at ambient temperatures (2)(3). Solid-state defects offer advantages of scalability and ease of device fabrication. Point defects as spin qubits have been demonstrated in traditional semiconductor systems (4), including the nitrogen-vacancy ($NV^-$) center in diamond and the spin-1/2 defect in doped silicon (3)(5)(6)(7)(8)(9)(10), among other possibilities (4)(11)(12)(13). In particular, Si-vacancy complex in diamond (14), vacancy defects in SiC (15)(16), and vacancy complexes in AlN (12) have been predicted as qubits. A neutral divacancy $(V_C\text{-}V_{Si})^0$ in SiC has been identified as a qubit with millisecond coherence time (17), where an improvement in dephasing time by over four orders of magnitude can be achieved by embedding the qubit in a decoherence-protected subspace through microwave dressing (18).

A key challenge in the development of controllable multiple-qubit systems is how to effectively couple spin defects and achieve high fidelity and long coherence times. The planar structures of atomically-thin 2D materials present a superior platform for realizing controlled creation and manipulation of defect qubits with better potential for scalability than the bulk materials. In 2D materials, defects can be generated by a number of existing approaches (19), and characterized and manipulated using atomic-level scanning probe techniques (20). The carbon-vacancy complex ($C_B$-$V_N$) in hexagonal boron nitride (h-BN) has emerged as the first such qubit (21), (22). Nitrogen vacancy complex defect ($N_B$-$V_N$) and the negatively charged boron vacancy defect ($V_B$) have also been proposed as qubit candidates in h-BN (23) (24) (25), and a number of point defects in h-BN show promise as ultra-bright single-photon emitters at room temperature (26) (27).

TMDs are a major class of 2D graphene cognates that are attracting intense current interest because of their sizable band gaps and high absorption coefficients, among other unique physical and chemical properties. Atomic defects in as-grown TMD samples, such as the anion vacancies (28), are well known to play an essential role in their electronic behavior (29). Compared to 3D wide-band-gap materials, the spin coherence time in $MoS_2$ has been estimated to be extremely long, on the order of 30 ms, suggesting the potential of TMDs as good host materials for multiple-qubit operation (30).

There is, therefore, a need for the discovery and rational design of novel defect qubits in 2D materials and their implementation in single- and multi-qubit platforms for QIS applications.

SUMMARY

Anion antisite defects in monolayer Transition Metal Dichalcogenide (TMD) systems are here identified as two dimensional solid-state defect qubits. The proposed antisites in these TMDs host paramagnetic triplet ground states with flexible level splitting. A viable transition loop between the triplet and singlet defect states is demonstrated, including optical excitations/relaxations and nonradiative decay paths for the antisites as qubits. A complete set of qubit operational processes, including initialization, manipulation and readout, is delineated.

In accordance with an embodiment of the invention, a solid-state spin quantum bit system for performing at least one of a quantum computing operation and a quantum information system operation, comprises a solid-state two-dimensional material comprising a neutral anion antisite defect. The neutral anion antisite defect is configured to be optically excited from a paramagnetic triplet ground state to an excited triplet state, and is configured to undergo nonradiative intersystem crossing processes between different spin-multiplet states, and is configured to provide two distinguishable luminescence signatures for two spin sublevels for quantum bit readout.

In further, related embodiments, the solid-state two-dimensional material may comprise a transition metal dichalcogenide (TMD), which may be a 2H phase material, and may comprise a material of the formula $MX_2$, where M comprises a material from the group consisting of molybdenum and tungsten, and X comprises a material from the group consisting of sulfur, selenium, and tellurium. For example, the material may be $WS_2$ or $WSe_2$. The neutral anion antisite defect may be configured to perform spin quantum bit operational processes comprising initialization, manipulation, and readout of the anion antisite defect as a spin quantum bit. An optical excitation source may be configured to excite the neutral anion antisite defect from the paramagnetic triplet ground state to the excited triplet state. A manipulation system may be configured to manipulate sublevels of the neutral anion antisite defect in the triplet ground state. A readout system may be configured to detect a difference in intensity of luminescence of different qubit states of the neutral anion antisite defect. The anion antisite defect may be configured to operate at room temperature. The system may comprise at least one of: a single-photon emitter, a quantum sensor, and a quantum register.

In other related embodiments, the solid-state spin quantum bit system may comprise a monolayer of the solid-state two-dimensional material; a first protective layer of hexagonal boron nitride (h-BN) on one side of the monolayer; and a second protective layer of hexagonal boron nitride (h-BN) on another side of the monolayer. The solid-state two-dimensional material of the monolayer may comprise a transition metal dichalcogenide (TMD), which may comprise a material of the formula $MX_2$, where M comprises a material from the group consisting of molybdenum and tungsten, and X comprises a material from the group consisting of sulfur, selenium, and tellurium; such as $WS_2$ and $WSe_2$.

In further embodiments, the solid-state spin quantum bit system may comprise more than one layer of the solid-state two-dimensional material comprising the neutral anion antisite defect, such as a bilayer, a trilayer, or more than three layers of the solid-state two-dimensional material.

In another embodiment, a method of performing at least one of a quantum computing operation and a quantum information system operation in a solid-state spin quantum bit system, comprises optically exciting a neutral anion antisite defect of a solid-state two-dimensional material from a paramagnetic triplet ground state to an excited triplet state, the neutral anion antisite defect being configured to undergo nonradiative intersystem crossing processes between different spin-multiplet states, and being configured to provide two distinguishable luminescence signatures for two spin sublevels for quantum bit readout.

In further related embodiments of the method, the solid-state two-dimensional material comprises a transition metal dichalcogenide (TMD), such as a material of the formula $MX_2$, where M comprises a material from the group consisting of molybdenum and tungsten, and X comprises a material from the group consisting of sulfur, selenium, and tellurium. The method may further comprise manipulating sublevels of the neutral anion antisite defect in the triplet ground state; and may further comprise detecting a difference in intensity of luminescence of different qubit states of the neutral anion antisite defect to perform a readout operation of the quantum bit.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 1A is a schematic illustration of the $$M_x^0$$

antisite defect in monolayer 2H-TMD. FIG. 1B is a schematic diagram showing in-gap defect levels of $$M_x^0$$

in six 2H-TMDs with triplet ground states. FIG. 1C is a schematic diagram illustrating correlation between the defect-level splittings and the z-positions of the antisites relative to those of the neighboring cations. FIG. 1D is a schematic diagram illustrating thermodynamical transition levels for the six antisite defects in 2H-TMDs.

in accordance with an embodiment of the invention. FIG. 2A is a schematic diagram showing optimized structure of the antisite defect $$W_s^0$$

showing its $C_{3v}$ local symmetry. FIG. 2B is a schematic energy diagram showing the defect levels in the triplet ground state $^3A_2$. FIG. 2C is a schematic diagram showing configuration coordinate diagram of $$W_s^0$$

in $WS_2$ for the triplet ground state $^3A_2$ and the triplet excited state $^3E$. FIG. 2D is a schematic diagram showing sublevels for the triplet ground state $^3A_2$, the triplet excited state $^3E$, and the singlet states $^1E$ and $^1A_1$, labeled by the IRREPS of $C_{3v}$.

including initialization, manipulation, and readout, in accordance with an embodiment of the invention.

Figure 4A:
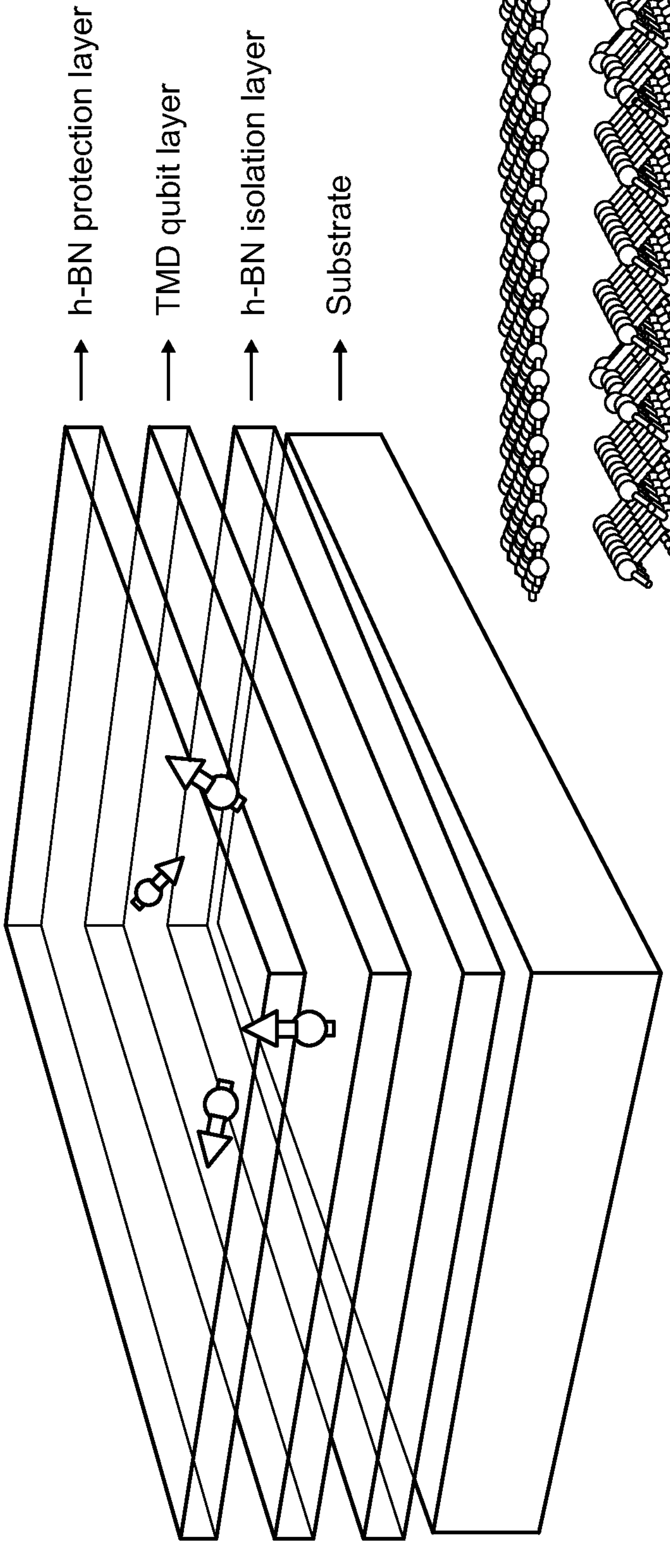
Figure 4B:
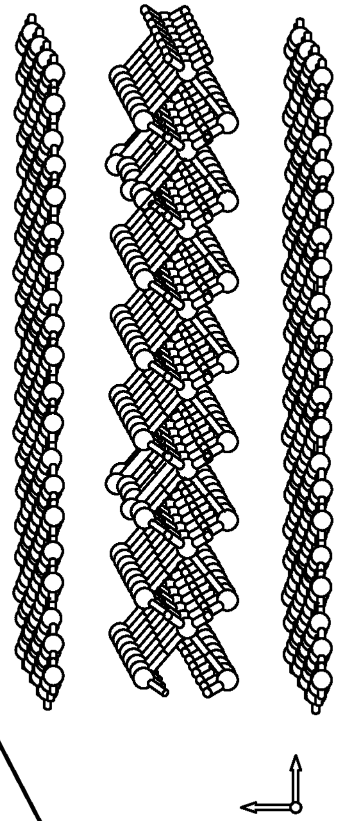
Figure 4D:
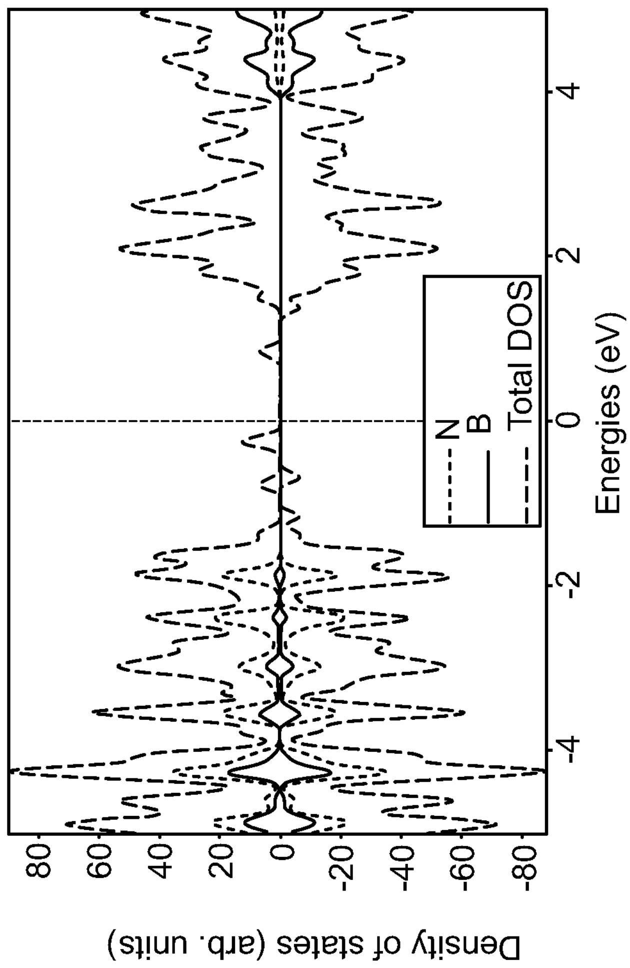
Figure 4C:
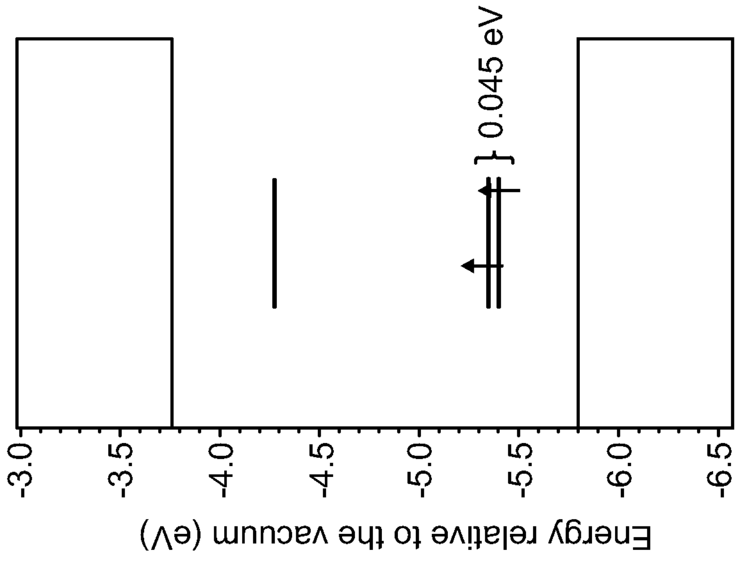

FIGS. 4A-4D are schematic diagrams illustrating a qubit device design based on the h-BN/$WS_2$/h-BN heterojunction structure, in accordance with an embodiment of the invention. FIG. 4A is a schematic diagram of a proposed 2D-heterojunction structure. FIG. 4B is a schematic diagram of the optimized heterojunction in a 2×2 supercell with h-BN as the top and bottom layers and $WS_2$ with antisites $$W_s^0$$

as the middle layer. FIG. 4C is a schematic diagram showing the in-gap defect levels where two electronic levels are occupied by spin-up electrons in a triplet ground state. FIG. 4D is a schematic diagram showing computed density of states of the heterojunction and the projected density of states on B and N atoms.

Figure 5:
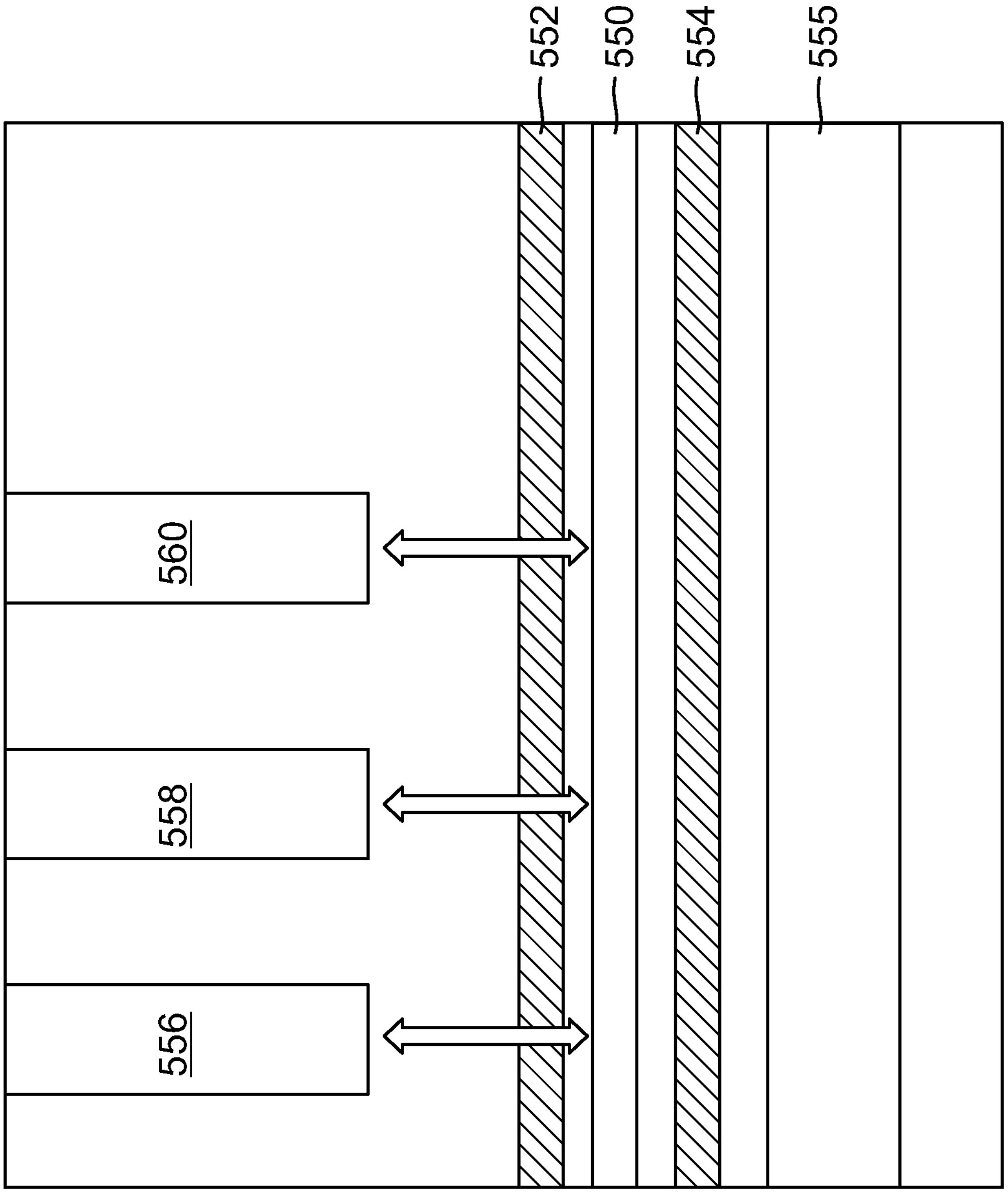

FIG. 5 is a schematic diagram of a solid-state quantum bit system for performing at least one of a quantum computing operation and a quantum information system operation, in accordance with an embodiment of the invention.

DETAILED DESCRIPTION

A description of example embodiments follows.

Being atomically thin and amenable to external controls, two-dimensional (2D) materials offer a new paradigm for the realization of patterned qubit fabrication and operation at room temperature for quantum information sciences applications. Here we show that the antisite defect in 2D transition metal dichalcogenides (TMDs) can provide a controllable solid-state spin qubit system. Using high-throughput atomistic simulations, we identify several neutral antisite defects in TMDs that lie deep in the bulk bandgap and host a paramagnetic triplet ground state. Our in-depth analysis reveals the presence of optical transitions and triplet-singlet intersystem crossing processes for fingerprinting these defect qubits. As an illustrative example, we discuss the initialization and readout principles of an antisite qubit in $WS_2$, which is expected to be stable against interlayer interactions in a bilayer structure for qubit isolation and protection in future qubit based devices. Our study opens a new pathway for creating scalable, room-temperature spin qubits in 2D TMDs.

Here, we report the identification of anion antisite defects Mx in six $MX_2$ (M=Mo, W; X=S, Se, Te) TMD systems as novel 2D solid-state defect qubits obtained via a high-throughput search based on a new qubit formation hypothesis involving symmetry constraints as well as the host electronic structures. Our first-principles defect computations, see the Methods section below for details, demonstrate that the proposed antisites in these TMDs host paramagnetic triplet ground states with flexible level splittings controlled by site symmetries and both the in-plane and out-of-plane d orbital interactions. Taking Ws antisite in $WS_2$ as an especially viable case, we demonstrate a viable transition loop between the triplet and singlet defect states, including optical excitations/relaxations and nonradiative decay paths for the Ws antisite as a qubit. A complete set of qubit operational processes, including initialization, manipulation and readout steps is delineated to provide a blueprint for experimental verification.

Qubit Discovery Hypothesis

Our data driven defect qubit discovery effort in the TMDs is based on satisfying three major descriptors as follows. (a) A paramagnetic, long-lived triplet ground state with multiple in-gap defect levels. (b) An optical transition path between the ground and excited triplet states as well as a spin-selective (nonradiative) decay path between the different spin-multiplet states for qubit initialization. And, (c) distinguishable luminescence signatures for the two spin sublevels for qubit readout (4).

Before we turn to discuss how the interplay of the host electronic structure and local site symmetry yields an anion antisite in the TMDs as a viable defect qubit, we note that wide bandgap compounds, such as SiC, AlN, and h-BN, are mostly characterized by occupied anion states as valence bands and unoccupied cation states as conduction bands. As a result, cation (anion) vacancy defect levels originate from anion (cation) dangling-bond states that are usually located in the valence (conduction) band. Therefore, it becomes necessary to introduce impurities next to the vacancies (4) or apply strain perturbations (12) in the wide-band-gap systems to create additional energy splittings to push the defect levels into the gap. Monolayer group-VI TMDs possess fundamentally different electronic structures that are characterized by dominant d-state contributions to both the conduction and valence band edges, so that point defects created by the cations such as the anion antisites and anion vacancies/complexes are more likely to host deep in-gap defect levels. Notably, intrinsic defects including vacancies and anion antisites have been observed experimentally in the TMDs (31).

It is useful to recall here that a triplet ground state is preferred (Hund's rule) when the exchange energy involving the interaction of two parallel spins is favorable compared to the energy required to lift one of the electrons to a higher level. In other words, a small energy splitting between the two highest occupied levels is a prerequisite for stabilizing the triplet ground state. An energetically favorable scenario is that the local site-symmetry of the point defect belongs to a point group with at least one 2-dimensional (2D) irreducible representation (IRREP). The 2D IRREP may generate doubly degenerate defect levels and hence a strong tendency to create a triplet ground state when these two levels are the highest occupied levels as is the case for the NV center in diamond. d states of transition metal cations in TMDs tend to have relatively large exchange energies, which favors a triplet ground state in keeping with the Hund's rule.

Antisites in Group-VI TMDs as a Qubit Platform

Based on the preceding discussion of our hypothesis, we performed a symmetry-based data-mining search to identify nonmagnetic and relatively stable $MX_2$ TMD compounds from the 2D materials database C2DB (32) with computed band gaps larger than 1.4 eV and energies above the convex hull less than 0.1 eV/atom. 27 TMD compounds are identified and assigned to three different phases, 2H, 1T, and 1T' and the corresponding point groups, $D_{3h}$, $D_{3d}$, and $C_{2h}$, respectively. 1T' phase is ruled out since the $C_{2h}$ point group does not have a 2D IRREP. For group-VI TMDs, the 2H phase is more stable than the 1T phase under equilibrium conditions (33). Therefore, we focus on six nonmagnetic group-VI 2H TMDs MX2 (M: Mo, W; X: S, Se, Te). We performed high-throughput defect computations and the results and found that no anion vacancy in group-VI TMDs hosts a triplet ground state, which is partly due to the fact that cation dangling bond states are high in the conduction band. We thus ruled out isolated anion vacancies and focused on anion antisite defects in the 2H TMDs.

Figure 1A:
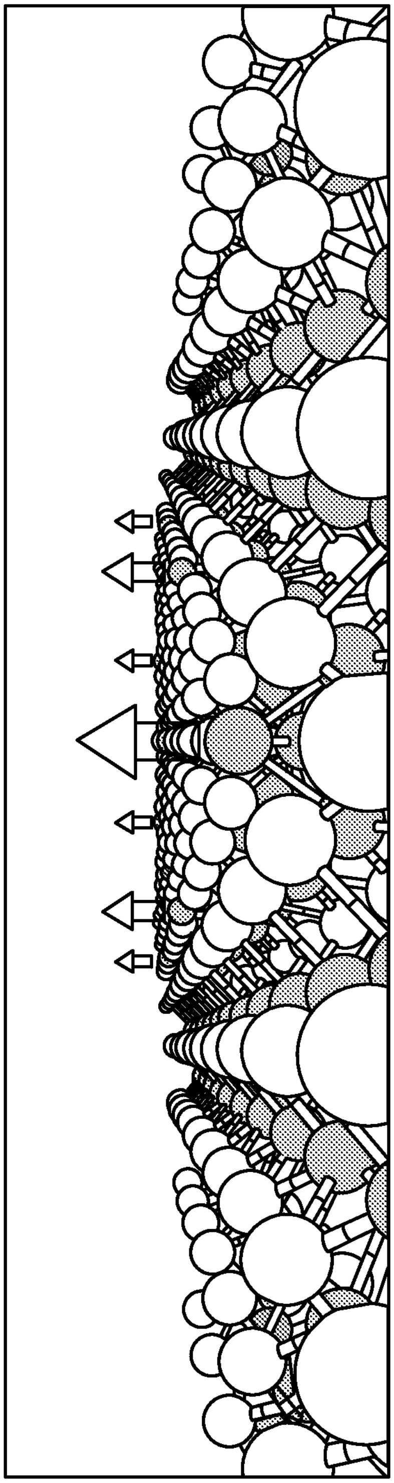
FIGS. 1A-1D are schematic diagrams illustrating anion antisite defects in six 2H transition metal dichalcogenides, in accordance with an embodiment of the invention.
Figure 1B:
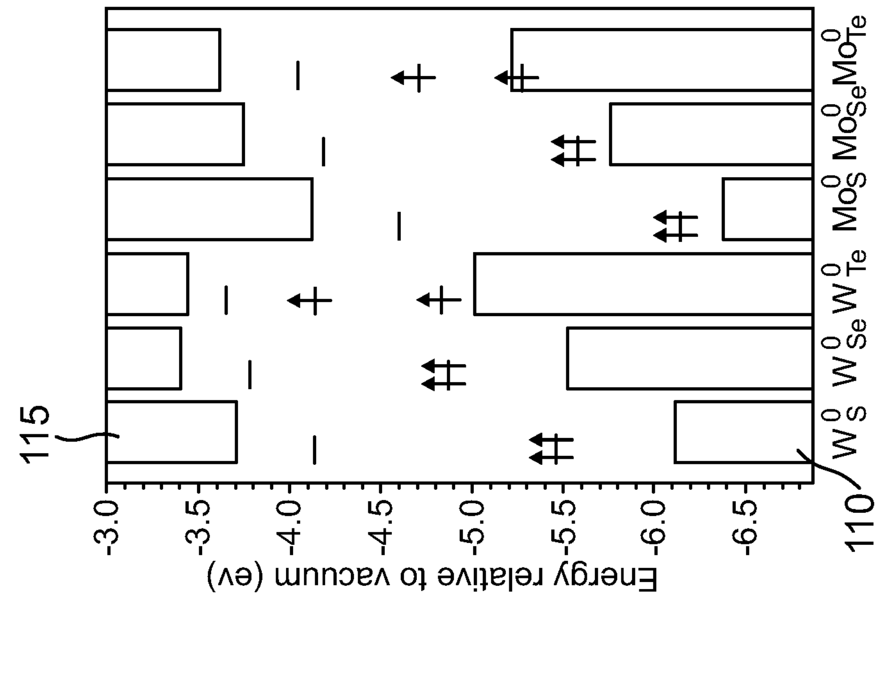

FIG. 1A presents an example of an anion antisite in TMDs where a cation is located on an anion site in the crystal lattice. The location and occupation of defect levels created by the antisite are controlled by its interaction with the three cation atoms in the central atomic layer as well as the defect charge state (see Methods). Defect levels of six anion antisites $$M_X^0$$

in the band gaps of 2H-MX 2 (M: Mo, W; X: S, Se, Te) were computed and those of the neutral antisites are shown in FIG. 1B. It is remarkable that all the six 2H TMDs host neutral antisites in a triplet ground state. Note that it has been predicted that anion antisite in $WS_2$ (34) and $MoS_2$ (35) favors a triplet state. In spite of the universal presence of triplet ground state in six antisite systems, we emphasize that the level splittings for the three defect levels in the spin-up channel are not universal (FIG. 1B). Constructed mainly from $d_{x^2-y^2}$, $d_{xy}$, and $d_{z^2}$ orbitals of the cation atoms located at the antisites, the three defect levels of the six 2H TMDs fall into two level-splitting patterns characterized by the position of the $d_{z^2}$ level relative to the $d_{x^2-y^2}$ and $d_{xy}$ levels. For the neutral antisites in $MoS_2$, $MoSe_2$, $WS_2$, and $WSe_2$, the two highest occupied levels in the gap are doubly degenerate, while those in $MoTe_2$ and $WTe_2$ generate three discrete defect levels in the band gaps of the host material.

FIGS. 1A-1D are schematic diagrams illustrating anion antisite defects in six 2H transition metal dichalcogenides, in accordance with an embodiment of the invention. FIG. 1A is a schematic illustration of the $$M_X^0$$

Figure 1C:
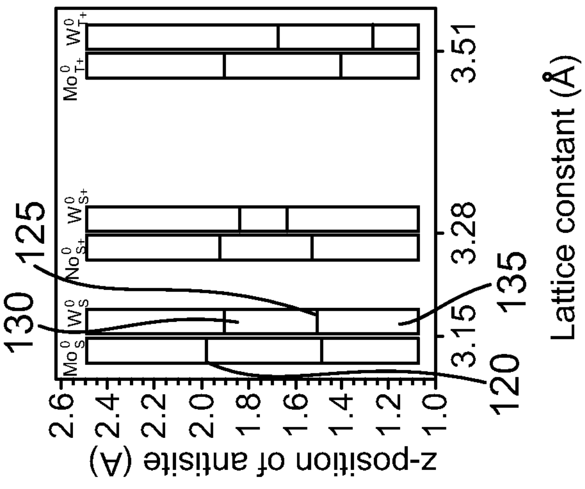
Figure 1D:
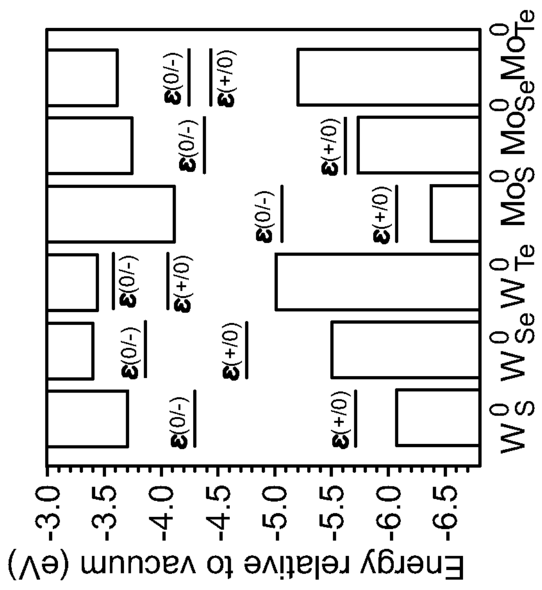

(antisite defect in monolayer 2H-TMD. FIG. 1B is a schematic diagram showing in-gap defect levels of $M_X^0$ (in six 2H-TMDs with triplet ground states. The bars represent the valence 110 and conduction 115 bands of the host materials. Note that $M_{S/Se}^0$ has doubly degenerate highest-occupied defect levels, whereas in the case of $M_{Te}^0$ there is a splitting between the occupied defect levels. FIG. 1C is a schematic diagram illustrating correlation between the defect-level splittings and the z-positions of the antisites relative to those of the neighboring cations. Lines 120 mark the equilibrium z positions of antisite defects, while the lines 125 indicate the critical z positions where a transition from the 2-1 type splitting (bars 130) to the 1-2 type splitting (bars 135) takes place. FIG. 1D is a schematic diagram illustrating thermodynamical transition levels for the six antisite defects in 2H-TMDs. ϵ(+/0) and ϵ(0/−) denote the transition level from the charge state +1 to 0, and from 0 to −1, respectively. Neutral charge states are thermodynamically stable when the Fermi level is close to the mid-gap.

In order to gain insight into the differences in defect level-splittings in various 2H TMDs, we adopt a local-symmetry analysis. The local symmetry for the unperturbed environment of an antisite is $C_{3v}$ which is a subgroup of the crystal point group $D_{3h}$ of pristine 2H-$MX_2$ systems. In 2H-$MX_2$ compounds, the d orbitals hybridize and transform into 2D IRREP E and 1D IRREP $A_1$. Within this local symmetry, $d_{x^2-y^2}$ and $d_{xy}$ orbitals at the antisites belong to the 2D IRREP E while the $d_{z^2}$ orbital belongs to the 1D IRREP $A_1$. The doubly degenerate $d_{x^2-y^2}$ and $d_{xi}$ orbitals at the antisites interact with the three neighboring cations mainly in the x-y plane. Their energy levels are therefore affected by the M-M distances or the lattice constants. On the other hand, the interaction between the $D_{z^2}$ orbitals of the antisites and the three cations is determined by the location of the antisite defect along the z-direction relative to the cation layer.

Our analysis indicates that, due to differences in orbital interactions, the $D_{z^2}$ defect level shifts up in energy relative to the $d_{x^2-y^2}$ and $d_{xy}$ levels as the antisite moves away from the cation layer along the z-direction. This relative shift in energies eventually reaches a critical point where the level switching takes place. However, as shown in FIG. 1C, position of the antisite along the z-direction in equilibrium structure (lines 120) is negatively correlated with the lattice constant. Due to differences in the critical z-positions (lines 125), where the levels undergo switching, two level-splitting patterns emerge depending on the lattice constants of the host materials. Since the lattice constants of the six 2H TMDs are mainly determined by anion species, we see a clear correlation between the level-splitting pattern and anion species. For antisites in $MoS_2$, $MoSe_2$, $WS_2$, and $WSe_2$, the $d_{x^2-y^2}$ and $d_{xy}$ levels are located below the $d_{z^2}$ level (2/1 splitting), while opposite is the case for $MoTe_2$ and $WTe_2$ (1/2 splitting).

Determined by the charge balance, $n_M - n_X = 4-2 = 2$, where $n_M$ and $n_X$ denote the number of valence electrons on the M and X sites, respectively, the neutral antisite has two extra electrons after bonding which can occupy two defect levels in the gap, creating two occupied levels and one unoccupied level in the up-spin channel in the triplet state. In the case of 2/1 splitting, the lowest two levels $d_{x^2-y^2}$ and $d_{xy}$ are occupied and remain doubly degenerate. In the case of 1/2 splitting ($MoTe_2$ and $WTe_2$), in contrast, a single electron occupying $d_{x6^2-y^2}$ and $d_{xy}$ levels introduces a sizable spontaneous Jahn-Teller distortion which reduces the site-symmetry $C_{3v}$ approximately to the point-group symmetry $C_h$ and pushes the occupied $d_{x^2-y^2}$ level down and closer to the $d_{z^2}$ level. We emphasize that different level-splitting patterns of neutral antisites in the 2H TMD family originate from the unique anisotropic orbital interactions in 2D materials.

In order to evaluate the stabilities of neutral antisite defects in the six 2H TMDs, we calculate the thermodynamic charge transition levels shown in FIG. 1D. Charge state corrections for the charged antisite systems are adopted by utilizing an extrapolation method (see Methods section below) (36), (37). Energy windows for the Fermi level in the gap where the neutral charge state is most stable are 1.43 eV, 0.88 eV, 0.48 eV, 1.01 eV, 1.24 eV, 0.19 eV for $W_S^0$, $W_{Se}^0$, $W_{Te}^0$, $Mo_S^0$, $Mo_{Se}^0$ and $Mo_{Te}^0$, respectively. Note that our thermodynamic transition levels, obtained via the hybrid functional calculations, are expected only to capture the trends in defect stabilities. However, it is reasonable to expect that neutral antisite defects will be stable in these 2H-TMDs when the Fermi level is close to the mid-gap.

For a viable defect qubit, the defect levels related to qubit operation must be deep in the gap to minimize effects of disruptive interactions with the bulk bands. The highest occupied defect levels of $Mo_s^0$, $Mo_{Se}^0$, $Mo_{Te}^0$ and $W_{Te}^0$ lie close (within 0.3 eV) to the valence band maximum (VBM) of the host materials. In contrast, the defect levels in $W_s^0$ and $W_{Se}^0$ are sufficiently deep (about 0.6 eV above the VBM) for qubit operation (38). Among the six anion antisites, $W_S^0$ and $W_{Se}^0$ are therefore the most promising candidates as novel defect qubits in 2D TMDs.

Antisite Defect Qubit in $WS_2$

Figure 2A:
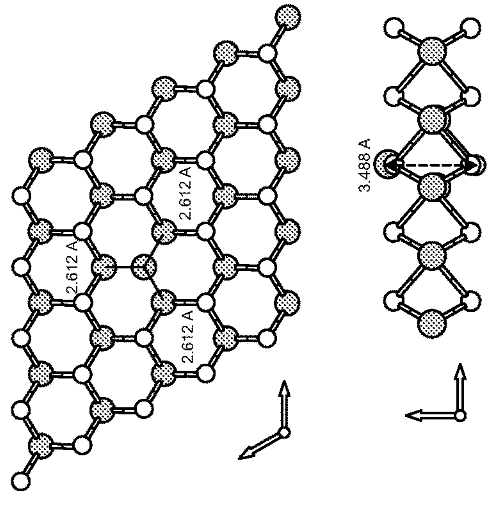
FIGS. 2A-2D are schematic diagrams illustrating the electronic and geometric structure of the neutral antisite defect $$W_s^0$$
Figure 2B:
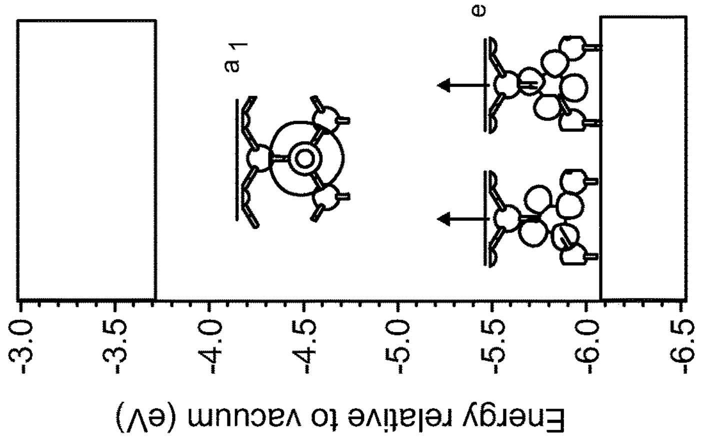
Figure 2C:
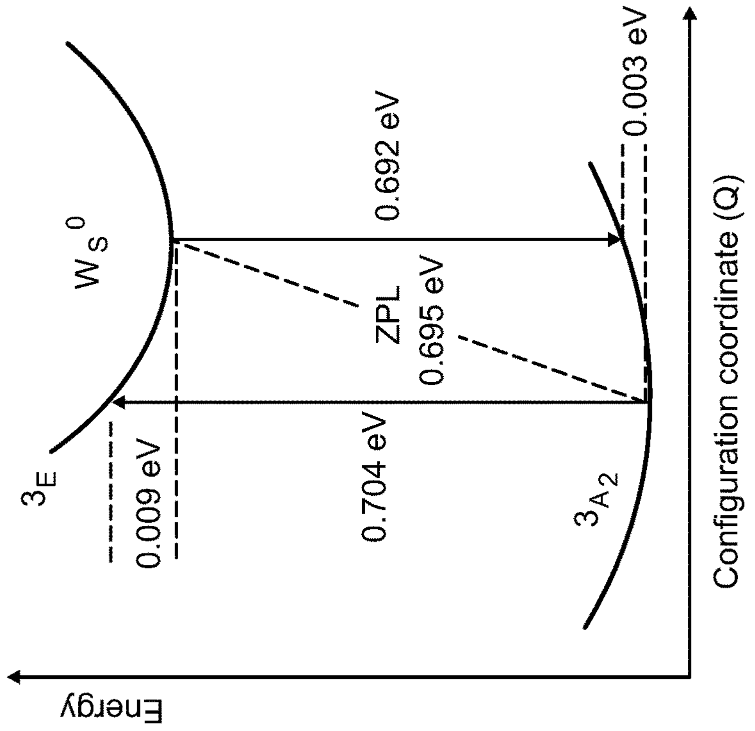
Figure 2D:
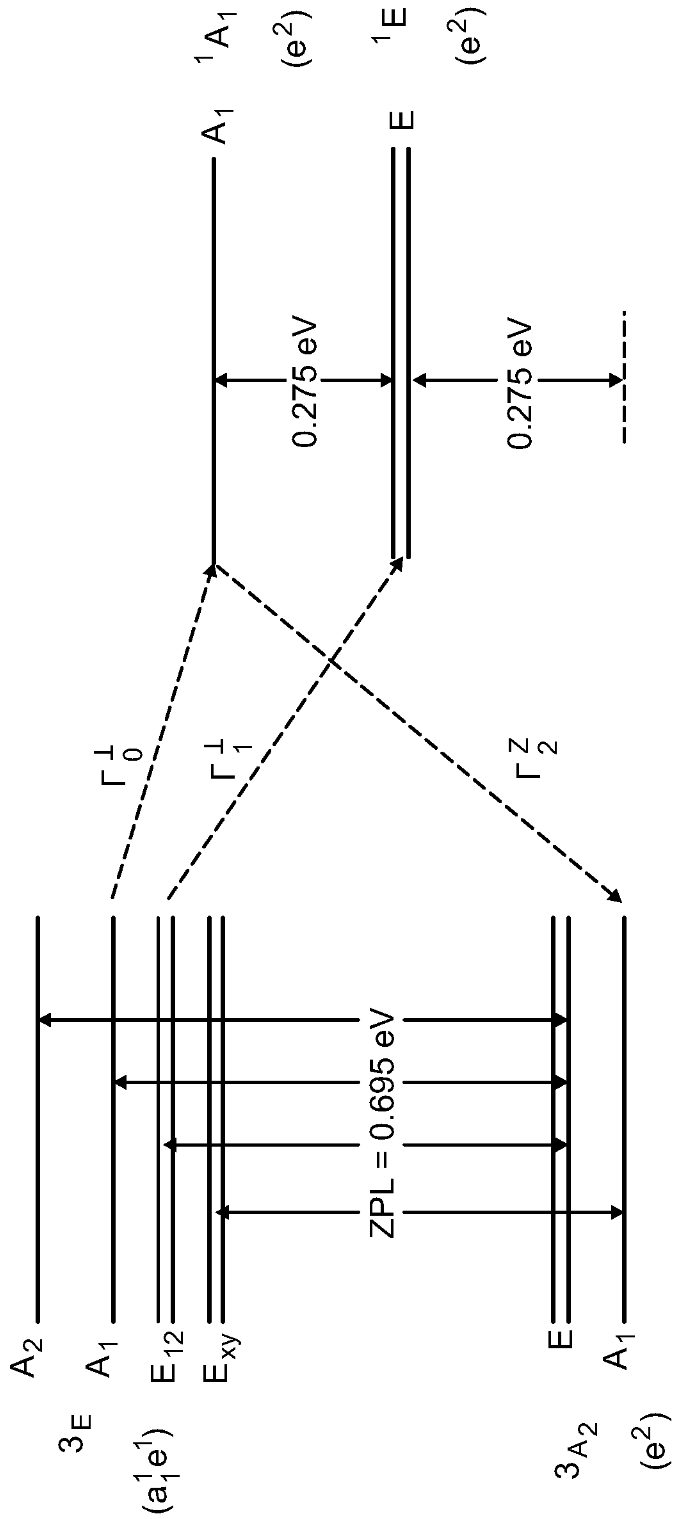

We now discuss $W_S^0$ in $WS_2$ as a benchmark system to demonstrate the operation principle of our antisite defect qubits, with reference to FIGS. 2A-2D. FIGS. 2A-2D are schematic diagrams illustrating the electronic and geometric structure of the neutral antisite defect $$W_S^0$$

in $WS_2$, in accordance with an embodiment of the invention. FIG. 2A is a schematic diagram showing optimized structure of the antisite defect $$W_S^0$$

in $WS_2$, showing its $C_{3v}$ local symmetry. FIG. 2B is a schematic energy diagram showing the defect levels in the triplet ground state $^3A_2$. The defect levels e and $a_1$ are mainly composed of the $\{d_{x^2-y^2}, D_{xy}\}$ and $d_z{}^2$ orbitals of the defect. Schematics of the wavefunctions involved are shown. FIG. 2C is a schematic diagram showing configuration coordinate diagram of $$W_S^0$$

in $WS_2$ for the triplet ground state $^3A_2$ and the triplet excited state $^3E$. FIG. 2D is a schematic diagram showing sublevels for the triplet ground state $^3A_2$, the triplet excited state $^3E$, and the singlet states $^1E$ and $^1A_1$, labeled by the IRREPS of $C_{3v}$. Spin-conserving optical transitions are shown by the four solid arrows on the left of FIG. 2D. Symmetry-allowed intersystem-crossing paths are noted by dashed arrows. The labels $$\{\Gamma_0^\perp, \Gamma_1^\perp\} \text{ and } \Gamma_2^z$$

indicate the allowed intersystem-crossing paths via the non-axial spin-orbit coupling and the axial spin-orbit coupling, respectively.

A pristine monolayer of $WS_2$ in the H-phase is composed of three hexagonal layers that form a sandwich-like structure (S-W-S). We define the direction of the c lattice vector as the z-axis. The sulfur atoms occupy the upper and lower hexagonal sublattice sheets with a symmetrical W plane lying between these sheets. The optimized structure indicates that the W-S and S-S distances are 2.391 Å and 3.107 Å, respectively (33) (39). Hybrid functional calculations predict a band gap of 2.40 eV which is close to the experimental value of about 2.41 eV (40). The optimized structure of the anion antisite $$W_S^0$$

is shown in FIG. 2A. The local environment of $$W_S^0$$

without perturbation has $C_{3v}$ symmetry with the rotation axis lying along the z-direction. Note that if the antisite in $WS_2$ is initially perturbed by a random displacement, the symmetry of the resulting structure can be lowered from Civ to Ch with a lower energy by ~30 meV per unit cell compared to the metastable structure with $C_{3v}$ symmetry.

The calculated electronic structure of $$W_S^0$$

hosts a triplet ground state. The in-gap defect levels can be labeled by IRREPS of the point-group $C_{3v}$ as shown in FIG. 2B. The ground and excited states of $$W_S^0$$

are described by single Slater determinants as $e^2$ and $$a_1^1 e^1,$$

respectively. Note that one can equivalently express a many-body state by either electron occupation or hole occupation of the single-particle orbitals (41). From this point of view, the defect levels of $NV^-$ center in diamond (hole occupation) is identical to the defect levels of $$W_S^0$$

(electron occupation) in terms of single Slater determinants (41) (42) (43). Therefore, we will adopt the state symbols for $e^2$ and $$a_1^1 e^1$$

as $\{^3A_2, {}^1E, {}^1A_1\}$, and $^3E$, respectively.

To get access to the transition processes involving the triplet ground state $^3A_2$ and the triplet excited state $^3E$, we perform constrained DFT (CDFT) calculations (44) (45) (46) (47) where occupations of the Kohn-Sham orbitals are constrained to desirable configurations. As shown in the configuration coordinate diagram (FIG. 2C), the zero-phonon line (ZPL) for the internal transition between the triplet ground and triplet excited states is 0.695 eV, which is in the near infrared (IR) range. The Franck-Condon relaxation energies are 0.009 eV and 0.003 eV for the excited and ground states, respectively. These extremely small vibrational couplings in the internal transitions imply that antisite defects in TMDs may be suitable for other QIS applications such as single-photon emitters, quantum sensors, and quantum registers.

Positions of singlet states are significant for nonradiative decay paths that connect triplet and singlet states. We estimate positions of singlet states $^1E$ and $^1A_1$ by considering the Coulomb interaction (42) (48). (Note that since the singlet state $^1A_1$ is strongly correlated, it cannot be described accurately as a single-particle Kohn-Sham state). Since we have the same local symmetry, we can adopt the results for the $NV^-$ center (42) in which the ratio of energy shifts for $^1E$ and $^1A_1$ relative to $^3A_2$ is 1:2. The energy difference obtained by first-principles calculations between $^1E$ and $^3A_2$ is 0.275 eV, from which the energy difference between $^1A_1$ and $^3A_2$ can be estimated to be 0.55 eV. Considering that the ZPL of the triplet states is 0.695 eV, it indicates that singlet states $^1E$ and $^1A_1$ are located between the triplet excited state $^3E$ and the triplet ground state $^3A_2$ (FIG. 2D). The energy difference between $^1E$ and $^1A_1$ is estimated to be 0.275 eV, which is associated with the ZPL between $^1E$ and $^1A_1$ estimated by the Coulomb interaction.

In order to operate as a qubit, a defect center must have distinct signatures of optical transitions involving various sublevels and support nonradiative decay paths (15) (49). The spin-orbit coupling (SOC) effects and the associated sublevels are important for ascertaining allowed intersystem crossings (ISCs) between different spin configurations (50). The spin-orbit operator $H_{so}$ with $C_{3v}$ symmetry can be defined as $$H_{so} = \sum_k \lambda_{xy}(l_k^x s_k^x + l_k^y s_k^y) + \lambda_z l_k^z s_k^z, \quad (42)$$

where $$l_k^i \text{ and } s_k^i$$

are angular momentum operator and spin operator projected to the $i^{th}$ component for the $k^{th}$ electron. The nonaxial strength and axial strength of spin-orbit coupling are represented by $\lambda_{xy}$ and $\lambda_z$. One can rewrite $H_{so}$ in terms of raising and lowering operators of angular momenta in the form $$H_{so} = \sum_k \lambda_{xy}(l_k^+ s_k^- + l_k^- s_k^+) + \lambda_z l_k^z s_k^z,$$

where $$l_k^\pm \text{ and } S_k^\pm$$

are raising and lowering operators for angular momentum operator and spin operator, respectively. Note that the nonaxial components contain $l_\pm$ and $s_\pm$ which mix states with different single Slater determinants and spin projections. On the other hand, the axial component contains $l_z$ and $s_z$, which can only mix the same single Slater determinants and spin projections (42). Note that in $NV^-$ center the nonaxial spin-orbit interaction is much weaker than the axial one (51).

Determined by matrix element of the spin-orbit operator $H_{so}$, intersystem crossing is allowed if $\langle\Psi_i|H_{so}|\Psi_f\rangle$ is nonzero. Since $H_{so}$ is a scalar operator which belongs to IRREP $A_1$, its matrix element will be non-zero only if the IRREPs involved satisfy the condition: $\text{rep}(\Psi_i) \otimes \text{rep}(H_{so}) \otimes \text{rep}(\Psi_f) \supset A_1$. (52) Because $H_{so}$ belongs to the totally symmetric IRREP $A_1$, nonzero matrix element exists only if $\Psi_i$ and $\Psi_f$ have same IRREPS. In the triplet ground state, the spatial wavefunction $\psi_{spatial}$ belongs to $A_2$ and the three spin projectors $\{S_x, S_y\}$ and $S_z$ belong to E and $A_2$, respectively. Dimension of the sublevel space is three, given by the product of the dimensions of $\psi_{spatial}$ (1D) and the spin projectors (3D). The corresponding sublevels are labeled by the IRREPS of $C_{3v}$ which are E and $A_1$. Note that the IRREPS of E and $A_1$ have spin components $\{S_x, S_y\}$ and $S_z$, respectively. The triplet excited state $^3E$ has a six-dimensional sublevel-space which belongs to IRREPS $\{E_{12}, E_{xy}, A_1, A_2\}$. The IRREPS $\{E_{12}, A_1, A_2\}$ and the IRREP $E_{xy}$ have spin components $\{S_x, S_y\}$ and $S_z$, respectively. The singlet states $^1E$ and $^1A_1$ form sublevels labeled by E and $A_1$ which share the common spin-zero component ($S_0$). Based on the symmetry analysis of these sublevels, the allowed intersystem crossing paths $$\Gamma_0^\perp, \Gamma_1^\perp, \text{ and } \Gamma_2^z$$

are identified. The allowed spin-conserving optical transitions and intersystem crossing are shown in FIG. 2D. Note that $$\Gamma_0^\perp, \Gamma_1^\perp$$

involve the nonaxial components of $H_{so}$ while $$\Gamma_2^z$$

involves its axial component.

Qubit Operation Principle

Figure 3:
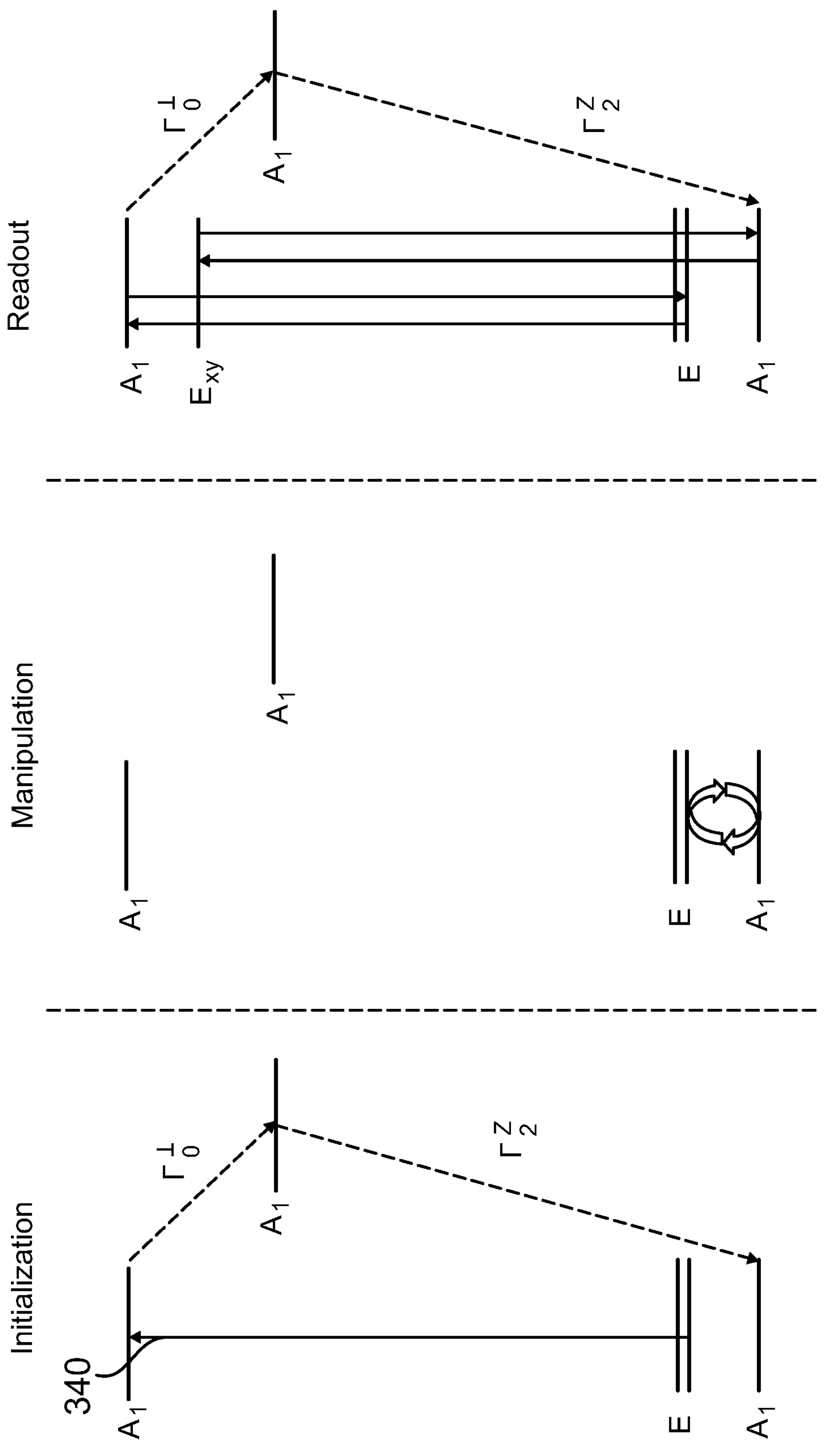
FIG. 3 is a schematic diagram showing an operational loop for the antisite qubit $$W_s^0$$

A complete loop for qubit operation based on $$W_S^0$$

in $WS_2$ is illustrated in FIG. 3, which is a schematic diagram showing an operational loop for the antisite qubit $$W_S^0,$$

including initialization, manipulation, and readout, in accordance with an embodiment of the invention. Initialization is shown in the left panel of FIG. 3: the defect center is pumped optically (solid line 340) from the sublevel E in the triplet ground state $^3A_2$ to the sublevel $A_1$ in the triplet excited state $^3E$, and then the defect center relaxes back to the sublevel $A_1$ in the triplet ground state via intersystem-crossing paths $$\Gamma_0^\perp \text{ and } \Gamma_2^z$$

(dashed lines). Manipulation is shown in the middle panel of FIG. 3: the qubit can be manipulated by using electron paramagnetic resonance (EPR) on one of the sublevels E and the sublevel $A_1$ in the triplet ground state. The blue circular arrows indicate the manipulation process via microwave pulse. Readout is shown in the right panel of FIG. 3: the defect center is optically pumped again, and the intensities of luminescence involving different initial states are detected. Note that the luminescence process $E_{xy}(^3E)\rightarrow A_1(^3A_2)$ (thick line with downwards arrow) has higher intensity than the process $A_1(^3E)\rightarrow E(^3A_2)$ (thin line with downwards arrow) due to the existence of intersystem-crossing paths (dashed lines) that weaken the radiative transition.

The initialization, manipulation, and readout of our TMD-based antisite qubit resembles the operation of defect qubits in the well-known $NV^-$ center in diamond (4) (15) (53). We choose the sublevel $A_1$ and one of sublevels in E in the triplet ground state $^3A_2$ as a two-level qubit system. Initialization of the qubit could then be achieved by optically pumping the defect center from the sublevel E in the triplet ground state $^3A_2$ to the sublevel $A_1$ in triplet excited state $^3E$. The sublevel $A_1$ in the triplet excited state has an allowed intersystem crossing to the sublevel $A_1$ in the singlet state $^1A_1$ via path $$\Gamma_0^+,$$

and then the system can relax back to the sublevel $A_1$ in the triplet ground state via path $$\Gamma_2^z.$$

The above transition processes form a complete cycle for the initialization of the qubit.

The manipulation of the qubit could be implemented by utilizing one of the sublevels E and the sublevel $A_1$ in the triplet ground state using electron paramagnetic resonance (EPR) or optically detected magnetic resonance (ODMR) technique if a high spin-polarization exists (54). Note that the luminescence from sublevels E is expected to be weaker than that from the sublevel $A_1$ due to the existence of an intersystem crossing path $$\Gamma_0^+.$$

Readout of the qubit can therefore be realized by detecting the difference in intensity of the luminescence involving different qubit states. The set of proposed techniques presented above would enable qubit initialization, manipulation, and readout, forming the essential operation principles for antisite qubits in TMDs.

Qubit Protection Scheme and Spin Coherence

FIGS. 4A-4D are schematic diagrams illustrating a qubit device design based on the h-BN/$WS_2$/h-BN heterojunction structure, in accordance with an embodiment of the invention. FIG. 4A is a schematic diagram of a proposed 2D-heterojunction structure. FIG. 4B is a schematic diagram of the optimized heterojunction in a 2×2 supercell with h-BN as the top and bottom layers and $WS_2$ with antisites $$W_S^0$$

as the middle layer. The bottom h-BN layer isolates the qubit layer from the substrate, while the top h-BN layer provides protection against external environmental effects. FIG. 4C is a schematic diagram showing the in-gap defect levels where two electronic levels are occupied by spin-up electrons in a triplet ground state. FIG. 4D is a schematic diagram showing computed density of states of the heterojunction and the projected density of states on B and N atoms, which indicate that the qubit can be optically initialized and readout without significant perturbation from the h-BN isolation/protection layers owing to the very large band gap of h-BN and the type-I band alignment of h-BN and $WS_2$.

Our antisite qubits, which involve TMD monolayers will be susceptible to being destroyed by the molecules, ions, and other chemical species in the environment. To overcome this problem, we have investigated a qubit protection scheme (FIG. 4B) in which the $MX_2$ monolayer is capped on both sides with a layer of hexagonal boron nitride (h-BN) as a protective cover. Based on first-principles computations using the hybrid functional with the standard mixing parameter and the inclusion of van der Waals corrections (optPBE-vdW) for structural relaxation (55) (56), we find that the triplet ground state is preserved for the antisite qubit in the h-BN/$WS_2$/h-BN heterojunction (FIG. 4B). Energy separation between the highest occupied and the lowest unoccupied defect level in the spin-up channel (related to the ZPL energy) is around 1.1 eV, which is close to that in the monolayer system. A small level splitting of 0.045 eV is observed between the two occupied defect levels which is associated with the slight symmetry breaking induced by the neighboring h-BN layer.

The preceding observations indicate the effectiveness of adopting h-BN as protection layers to isolate the antisite qubits in monolayer TMDs from both environmental and substrate effects. As shown in FIG. 4C, the projected density of states (PDOS) on h-BN layers is located deep in the conduction and valence bands of the heterojunction due to the large bandgap of h-BN (~6 eV) and the type-I band alignment between h-BN and $WS_2$ (57). We thus expect that the key optical transitions related to the qubit operation will not be significantly affected by the h-BN isolation/protection layers. The protected antisite qubits in 2D heterostructures thus offer a novel and robust platform for quantum information technologies.

Another key factor concerns the spin decoherence time of a qubit. Taking $MoS_2$ as an example, previous work (30) has shown that the decoherence of the electron spin originates mainly from the presence of $^{95}Mo$ and $^{97}Mo$ cation nuclear spins, and that it can be greatly diminished by utilizing nuclear-spin-free isotope $^{95}Mo$ with which an exceptionally long spin coherence time (more than 30 ms) is predicted due to the small gyromagnetic ratio ($\gamma$) of $^{95}Mo$. Since the ratio $\gamma(^{183}W)/\gamma(^{95}Mo)$ is 0.64, we expect that even longer spin coherence time should be possible to achieve in $WS_2$ and $WSe_2$ based defect qubits for realizing controllable multi-qubit operations in solid-state 2D systems.

Schematic Diagram

FIG. 5 is a schematic diagram of a solid-state quantum bit system for performing at least one of a quantum computing operation and a quantum information system operation, in accordance with an embodiment of the invention. The system includes a solid-state two-dimensional material 550 comprising a neutral anion antisite defect. The neutral anion antisite defect is configured to be optically excited from a paramagnetic triplet ground state to an excited triplet state, and is configured to undergo nonradiative intersystem crossing processes between different spin-multiplet states, and is configured to provide two distinguishable luminescence signatures for two spin sublevels for quantum bit readout. For example, the system can include a monolayer of the solid-state two-dimensional material 550, which can include a transition metal dichalcogenide (TMD), such as a material of the formula $MX_2$, where M comprises a material from the group consisting of molybdenum and tungsten, and X comprises a material from the group consisting of sulfur, selenium, and tellurium; in particular, for example, $WS_2$ or $WSe_2$. In addition, the system can include a first protective layer 552 of hexagonal boron nitride (h-BN) on one side of the monolayer 550, and a second protective layer 554 of hexagonal boron nitride (h-BN) on another side of the monolayer, such as the opposite side of the monolayer. A substrate 555 can also be included. The system can further include an optical excitation source 556 configured to excite the neutral anion antisite defect from the paramagnetic triplet ground state to the excited triplet state. For example, the optical excitation source 556 can perform optical pumping of the defect center. A manipulation system 558 can be configured to manipulate sublevels of the neutral anion antisite defect in the triplet ground state. For example, the manipulation system 558 can perform an electron paramagnetic resonance (EPR) technique; and can use manipulation via microwave pulse. In addition, manipulation can be performed using an optically detected magnetic resonance (ODMR) technique if a high spin-polarization exists. A readout system 560 can be configured to detect a difference in intensity of luminescence of different qubit states of the neutral anion antisite defect. For example, the readout system 560 can perform a process in which the defect center is optically pumped again, and the intensities of luminescence involving different initial states are detected.

Overview

Using a high-throughput materials discovery effort based on a defect-qubit design hypothesis involving the interplay of local symmetry of the defect and the electronic structure of the host, we identify thermodynamically stable, neutral anion-antisite defects in six monolayer 2H-$MX_2$ TMD compounds as potential defect-spin qubits hosting stable triplet ground states. The optical signatures of these qubits, including the ZPL for optical transitions, are evaluated using an in-depth analysis of the electronic configurations and the corresponding symmetry representations of the defect states in the antisites. Intersystem crossing channels for qubit initialization and operation are identified. A scheme for isolating and protecting the antisite qubits is proposed based on a h-BN/TMD/h-BN heterojunction structure. Our study opens a new pathway for creating spin-qubits and multi-qubit platforms for quantum information technologies based on defects in 2D solid-state systems.

Additional Techniques

Owing to the ultra-small Franck-Condon relaxation energies, the internal transitions of antisite spin-defects in transition metal dichalcogenides (TMDs) could be used as key components of quantum information technology platforms for single-photon emitters, quantum sensors, and quantum registers.

Data-driven searches using our novel qubit discovery descriptors and their generalizations will also yield viable anion antisites in multilayers of TMDs.

Data-driven searches using our novel qubit discovery descriptors and their generalizations will yield viable anion antisites in other families of two-dimensional materials beyond the TMDs to provide an expanded menu of solid-state defect-based spin-qubits for developing new platforms for quantum technologies.

Our qubit operational loop could be applied to other defect qubit systems in 2D materials for both the $C_{3v}$ and $C_h$, local defect symmetries.

Our qubit protection and isolation scheme based on the construction of two-dimensional heterojunction structures can be applied to protection/isolation of other qubits in 2D systems such as the vacancy complex qubits ($V_B$-$C_N$) in monolayer hexagonal boron nitride (h-BN).

Methods

Computational Details:

All the calculations were performed by using Vienna Ab initio Simulation Package (VASP) (58) based on the density functional theory (DFT) (59) (60). To calculate the spin density near the nuclei, the projector augmented wave method (PAW) (61) (62) and plane-wave basis set were applied together. Recent advances using hybrid functionals have led to accurate descriptions of defect states by overcoming the well-known band-gap problem of traditional DFT. Our calculations were performed using the screened hybrid functional of Heyd-Scuseria-Ernzerhof (HSE) (63) (64) with default mixing parameter and the standard range-separation parameter (0.2 $Å^{-1}$) to reproduce the experimental quasiparticle gap of pristine $WS_2$ (40). The plane-wave basis set energy cutoff was set to 320 eV. For defect supercell calculations, we adopt a special k-point at (0.25, 0.25, 0) in the first Brillouin zone. A vacuum space of 20 Å is added along the direction perpendicular to the monolayer in order to avoid interactions between adjacent images. Structural relaxations are performed for all the systems which converge until the force acting on each ion is less than 0.01 eV/Å. The convergence criteria for total energies of structural relaxations and self-consistent calculations are $10^{-4}$ eV and $10^{-5}$ eV, respectively. The constrained DFT (CDFT) methodology (44) (45) (46) (47) is adopted for calculations of excitation energies as the total-energy difference between two calculations where the occupations were constrained and the structures are fully relaxed.

Defect Formation and Transition Levels:

Relative stability of point defects depends on the charge state of the defects. We analyze this issue for antisite defects in TMDs by calculating the defect formation energies ($E_f$) with charge state q, which is defined as $E_f(\epsilon_F)=E_{tot}^q-E_{bulk}+\mu X+\mu M+q(\epsilon_F+E_V)+\Delta E$, where $E_{tot}^q$ is the total energy of the charged defect system with the charge q, $E_{bulk}$ is the total energy of the perfect $MX_2$ system, $\mu_M$ is the chemical potential of metal atom M, $\mu_X$ is the chemical potential of anion atom X, $\epsilon_F$ is the position of the Fermi-level with respect to the valence band maximum $E_V$, and $\Delta E$ is the charge correction energy. Transition levels are defined as $$\epsilon(q'/q) = \left(E_f^{q'} - E_f^q\right) / (q' - q),$$

where $$E_f^q$$

is the formation energy for charged state q. One can interpret the transition levels as the Fermi level positions at which the formation energies of the defect in two distinct charge states are equal. The ionized energy of donor/acceptor is defined as the energy difference of transition level $\epsilon(+/0)/\epsilon(0/-)$ and CBM/VBM. In low dimensional system, due to anisotropic screening, ionization energy (IE) diverges with respect to the vacuum. We adopted the charge correction method (36) (37). We assume that the chemical potential of M and X are in thermal equilibrium with $MX_2$, $\mu_{MX2}=\mu_M+2\mu_X$, where $\mu_{MX2}$ is the energy of perfect $MX_2$ system. The accessible range of $\mu_M$ and $\mu_X$ can be further limited by the lowest energy phases of these elements depending on growth conditions. It should be noted that the transition levels do not depend on the choice of chemical potentials.

REFERENCES (1) Bharath R. Quantum computing: a gentle introduction. *Choice: Current Reviews for Academic Libraries* 49, 345-346 (2011).

(2) Greentree A D, Fairchild B A, Hossain F M, Prawer S. Diamond integrated quantum photonics. *Materials Today* 11, 22-31 (2008).

(3) Pla J J, et al. A single-atom electron spin qubit in silicon. *Nature* 489, 541-545 (2012).

(4) Weber J R, et al. Quantum computing with defects. *P Natl Acad Sci USA* 107, 8513-8518 (2010).

(5) Kane B E. A silicon-based nuclear spin quantum computer. *Nature* 393, 133-137 (1998).

(6) Salfi J, et al. Quantum simulation of the Hubbard model with dopant atoms in silicon. *Nat Commun* 7, 11342 (2016).

(7) Zwanenburg F A, et al. Silicon quantum electronics. *Rev Mod Phys* 85, 961-1019 (2013).

(8) Doherty M W, Manson N B, Delaney P, Jelezko F, Wrachtrup J, Hollenberg LCL. The nitrogen-vacancy colour centre in diamond. *Physics Reports* 528, 1-45 (2013).

(9) Jelezko F, Gaebel T, Popa I, Gruber A, Wrachtrup J. Observation of Coherent Oscillations in a Single Electron Spin. *Physical Review Letters* 92, 076401 (2004).

(10) Huang P, et al. Observation of an anomalous decoherence effect in a quantum bath at room temperature. *Nat Commun* 2, 570 (2011).

(11) Gali A. Time-dependent density functional study on the excitation spectrum of point defects in semiconductors. *physica status solidi* (*b*) 248, 1337-1346 (2011).

(12) Seo H, Govoni M, Galli G. Design of defect spins in piezoelectric aluminum nitride for solid-state hybrid quantum technologies. *Scientific Reports* 6, 20803 (2016).

(13) Rogers L J, et al. All-Optical Initialization, Readout, and Coherent Preparation of Single Silicon-Vacancy Spins in Diamond. *PRL* 113, 263602-263602 (2014).

(14) Rogers L J, et al. All-Optical Initialization, Readout, and Coherent Preparation of Single Silicon-Vacancy Spins in Diamond. *Phys Rev Lett* 113, 263602 (2014).

(15) Weber J R, et al. Defects in SiC for quantum computing. *J Appl Phys* 109, 102417 (2011).

(16) Gali A. Time-dependent density functional study on the excitation spectrum of point defects in semiconductors. *Phys Status Solidi B* 248, 1337-1346 (2011).

(17) Christle D J, et al. Isolated electron spins in silicon carbide with millisecond coherence times. *Nature Mater* 14, 160-163 (2015).

(18) Miao K C, et al. Universal coherence protection in a solid-state spin qubit. *Science*, eabc5186 (2020).

(19) Zhong L, et al. Defect engineering of two-dimensional transition metal dichalcogenides. *2D Materials* 3, 022002 (2016).

(20) Wong D, et al. Characterization and manipulation of individual defects in insulating hexagonal boron nitride using scanning tunnelling microscopy. *Nature Nanotechnology* 10, 949 (2015).

(21) Tawfik S A, et al. First-principles investigation of quantum emission from hBN defects. *Nanoscale* 9, 13575-13582 (2017).

(22) Wu F, Galatas A, Sundararaman R, Rocca D, Ping Y. First-principles engineering of charged defects for two-dimensional quantum technologies. *Physical Review Materials* 1, 071001 (2017).

(23) Abdi M, Chou J-P, Gali A, Plenio M B. Color Centers in Hexagonal Boron Nitride Monolayers: A Group Theory and Ab Initio Analysis. *ACS Photonics* 5, 1967-1976 (2018).

(24) Ivady V, et al. Ab initio theory of the negatively charged boron vacancy qubit in hexagonal boron nitride. *npj Computational Materials* 6, 41 (2020).

(25) Vuong T Q P, et al. Phonon-Photon Mapping in a Color Center in Hexagonal Boron Nitride. *Physical Review Letters* 117, 097402 (2016).

(26) Aharonovich I, Toth M. Quantum emitters in two dimensions. *Science* 358, 170 (2017).

(27) Grosso G, et al. Tunable and high-purity room temperature single-photon emission from atomic defects in hexagonal boron nitride. *Nat Commun* 8, 705 (2017).

(28) Tongay S, et al. Defects activated photoluminescence in two-dimensional semiconductors: interplay between bound, charged, and free excitons. *Scientific Reports* 3, 2657 (2013).

(29) Wang D, Li X-B, Han D, Tian W Q, Sun H-B. Engineering two-dimensional electronics by semiconductor defects. *Nano Today* 16, 30-45 (2017).

(30) Ye M, Seo H, Galli G. Spin coherence in two-dimensional materials. *npj Computational Materials* 5, 44 (2019).

(31) Edelberg D, et al. Approaching the Intrinsic Limit in Transition Metal Diselenides via Point Defect Control. *Nano Letters,* 19, 4371 (2019).

(32) Haastrup S, et al. The Computational 2D Materials Database: high-throughput modeling and discovery of atomically thin crystals. *2D Materials* 5, 042002 (2018).

(33) Ataca C, Sahin H, Ciraci S. Stable, single-layer MX2 transition-metal oxides and dichalcogenides in a honeycomb-like structure. *The Journal of Physical Chemistry C* 116, 8983-8999 (2012).

(34) Li W-F, Fang C, van Huis M A. Strong spin-orbit splitting and magnetism of point defect states in monolayer $WS_2$. *Physical Review B* 94, 195425 (2016).

(35) Wang D, et al. Electronic and magnetic properties of MoS2 monolayers with antisite defects. *Journal of Physics and Chemistry of Solids* 131, 119-124 (2019).

(36) Wang D, et al. Determination of Formation and Ionization Energies of Charged Defects in Two-Dimensional Materials. *Physical Review Letters* 114, 196801-196801 (2015).

(37) Xia S, Wang D, Chen N-K, Han D, Li X-B, Sun H-B. Evaluation of Charged Defect Energy in Two-Dimensional Semiconductors for Nanoelectronics: The WLZ Extrapolation Method. *Annalen der Physik* 532, 1900318 (2020).

(38) Dreyer C E, Alkauskas A, Lyons J L, Janotti A, Van de Walle C G. First-principles calculations of point defects for quantum technologies. *Annual Review of Materials Research* 48, 1-26 (2018).

(39) Ding Y, Wang Y, Ni J, Shi L, Shi S, Tang W. First principles study of structural, vibrational and electronic properties of graphene-like MX2 (M=Mo, Nb, W, Ta; X=S, Se, Te) monolayers. *Physica B: Condensed Matter* 406, 2254-2260 (2011).

(40) Chernikov A, et al. Exciton binding energy and nonhydrogenic Rydberg series in monolayer WS(2). *Phys Rev Lett* 113, 076802 (2014).

(41) Choi S, Jain M, Louie S G. Mechanism for optical initialization of spin in NV-center in diamond. *Phys Rev B* 86, 41202-41202 (2012).

(42) Maze J R, et al. Properties of nitrogen-vacancy centers in diamond: the group theoretic approach. *New Journal of Physics* 13, 025025 (2011).
(43) Delaney P, Greer J C, Larsson J A. Spin-polarization mechanisms of the nitrogen-vacancy center in diamond. *Nano Lett* 10, 610-614 (2010).
(44) Dederichs P H, BlUgel S, Zeller R, Akai H. Ground states of constrained systems: Application to cerium impurities. *Physical review letters* 53, 2512 (1984).
(45) Wu Q, Van Voorhis T. Direct optimization method to study constrained systems within density-functional theory. *Physical Review A* 72, 024502 (2005).
(46) Kaduk B, Kowalczyk T, Van Voorhis T. Constrained density functional theory. *Chemical reviews* 112, 321-370 (2012).
(47) Jones R O, Gunnarsson O. The density functional formalism, its applications and prospects. *Rev Mod Phys* 61, 689-746 (1989).
(48) Doherty M W, Manson N B, Delaney P, Hollenberg L C L. The negatively charged nitrogen-vacancy centre in diamond: the electronic solution. *New Journal of Physics* 13, 025019 (2011).
(49) Gordon L, Weber J R, Varley J B, Janotti A, Awschalom D D, Van De Walle C G. Quantum computing with defects. *MRS Bulletin* 38, 802-808 (2013).
(50) Bassett L C, Alkauskas A, Exarhos A L, Fu K-M C. Quantum defects by design. *Nanophotonics* 8, 1867-1888 (2019).
(51) Manson N B, Harrison J P, Sellars M J. Nitrogen-vacancy center in diamond: Model of the electronic structure and associated dynamics. *Physical Review B* 74, 104303-104303 (2006).
(52) Marian, C M, Spin-Orbit Coupling in Molecules. In Reviews in Computational Chemistry (eds K. B. Lipkowitz and D. B. Boyd) (2001).
(53) Ivady V, Abrikosov I A, Gali A. First principles calculation of spin-related quantities for point defect qubit research. *npj Computational Materials* 4, 76 (2018).
(54) Wrachtrup J, Jelezko F. Processing quantum information in diamond. *Journal of Physics: Condensed Matter* 18, S807-S824 (2006).
(55) Klimeg J, Bowler D R, Michaelides A. Chemical accuracy for the van der Waals density functional. *Journal of Physics: Condensed Matter* 22, 022201 (2009).
(56) Román-Pérez G, Soler J M. Efficient Implementation of a van der Waals Density Functional: Application to Double-Wall Carbon Nanotubes. *Physical Review Letters* 103, 096102 (2009).
(57) Ghasemi majd Z, Amiri P, Taghizadeh S F. Ab-initio study of structural and electronic properties of WS2/h-BN van der Waals heterostructure. *Surface Science* 672-673, 13-18 (2018).
(58) Kresse G, Furthmilller J. Efficiency of ab-initio total energy calculations for metals and semiconductors using a plane-wave basis set. *Computational Materials Science* 6, 15-50 (1996).
(59) Kohn W, Sham L J. Self-consistent equations including exchange and correlation effects. *Physical Review* 140, (1965).
(60) Hohenberg P, Kohn W. Inhomogeneous electron gas. *Physical Review* 136, B864 (1964).
(61) Blöchl P E. Projector augmented-wave method. *Physical Review B* 50, 17953-17979 (1994).
(62) Joubert D. From ultrasoft pseudopotentials to the projector augmented-wave method. *Physical Review B—Condensed Matter and Materials Physics* 59, 1758-1775 (1999).
(63) Heyd J, Scuseria G E, Ernzerhof M. Hybrid functionals based on a screened Coulomb potential. *Journal of Chemical Physics* 118, 8207-8215 (2003).
(64) Krukau A V, Vydrov O A, Izmaylov A F, Scuseria G E. Influence of the exchange screening parameter on the performance of screened hybrid functionals. *Journal of Chemical Physics* 125, 224106 (2006).

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A solid-state spin quantum bit system for performing at least one of a quantum computing operation and a quantum information system operation, the system comprising:

a solid-state two-dimensional material comprising a neutral anion antisite defect, the solid-state two-dimensional material comprising a transition metal dichalcogenide TMD) comprising a 2H phase material of the formula $MX_2$, where M comprises a material from the group consisting of molybdenum and tungsten, and X comprises a material from the group consisting of sulfur, selenium, and tellurium;

the neutral anion antisite defect being configured to be optically excited from a paramagnetic triplet ground state to an excited triplet state, and being configured to undergo nonradiative intersystem crossing processes between different spin-multiplet states, and being configured to provide two distinguishable luminescence signatures for two spin sublevels for quantum bit readout.

2. The solid-state spin quantum bit system of claim 1, wherein the solid-state two-dimensional material comprises a material from the group consisting of $WS_2$ and $WSe_2$.

3. The solid-state spin quantum bit system of claim 1, wherein the neutral anion antisite defect is configured to perform spin quantum bit operational processes comprising initialization, manipulation, and readout of the anion antisite defect as a spin quantum bit.

4. The solid-state spin quantum bit system of claim 1, further comprising:

an optical excitation source configured to excite the neutral anion antisite defect from the paramagnetic triplet ground state to the excited triplet state.

5. The solid-state spin quantum bit system of claim 4, further comprising:

a manipulation system configured to manipulate sublevels of the neutral anion antisite defect in the triplet ground state.

6. The solid-state spin quantum bit system of claim 4, further comprising:

a readout system configured to detect a difference in intensity of luminescence of different qubit states of the neutral anion antisite defect.

7. The solid-state spin quantum bit system of claim 1, wherein the anion antisite defect is configured to operate at room temperature.

8. The solid-state spin quantum bit system of claim 1, wherein the system comprises at least one of: a single-photon emitter, a quantum sensor, and a quantum register.

9. A solid-state spin quantum bit system for performing at least one of a quantum computing operation and a quantum information system operation, the system comprising:

a monolayer of a solid-state two-dimensional material comprising a neutral anion antisite defect, the neutral anion antisite defect being configured to be optically excited from a paramagnetic triplet ground state to an excited triplet state, and being configured to undergo nonradiative intersystem crossing processes between different spin-multiplet states, and being configured to provide two distinguishable luminescence signatures for two spin sublevels for quantum bit readout;

a first protective layer of hexagonal boron nitride (h-BN) on one side of the monolayer; and a second protective layer of hexagonal boron nitride (h-BN) on another side of the monolayer.

10. The solid-state spin quantum bit system of claim 9, wherein the solid-state two-dimensional material of the monolayer comprises a transition metal dichalcogenide (TMD).

11. The solid-state spin quantum bit system of claim 10, wherein the solid-state two-dimensional material of the monolayer comprises a material of the formula $MX_2$, where M comprises a material from the group consisting of molybdenum and tungsten, and X comprises a material from the group consisting of sulfur, selenium, and tellurium.

12. The solid-state spin quantum bit system of claim 11, wherein the solid-state two-dimensional material comprises a material from the group consisting of $WS_2$ and $WSe_2$.

13. The solid-state spin quantum bit system of claim 1, comprising a layer of the solid-state two-dimensional material, and further comprising an additional layer of solid-state two-dimensional material, the additional layer comprising another neutral anion antisite defect.

14. A method of performing at least one of a quantum computing operation and a quantum information system operation in a solid-state spin quantum bit system, the method comprising:

optically exciting a neutral anion antisite defect of a solid-state two-dimensional material from a paramagnetic triplet ground state to an excited triplet state, the neutral anion antisite defect being configured to undergo nonradiative intersystem crossing processes between different spin-multiplet states, and being configured to provide two distinguishable luminescence signatures for two spin sublevels for quantum bit readout;

the solid-state two-dimensional material comprising a transition metal dichalcogenide (TMD) comprising a material of the formula $MX_2$, where M comprises a material from the group consisting of molybdenum and tungsten, and X comprises a material from the group consisting of sulfur, selenium, and tellurium.

15. The method of claim 14, further comprising manipulating sublevels of the neutral anion antisite defect in the triplet ground state.

16. The method of claim 15, further comprising:

detecting a difference in intensity of luminescence of different qubit states of the neutral anion antisite defect to perform a readout operation of the quantum bit.

* * * * *